(12) United States Patent
Tamura et al.

(10) Patent No.: US 12,342,473 B2
(45) Date of Patent: Jun. 24, 2025

(54) WIRING BOARD AND METHOD OF PRODUCING WIRING BOARD

(71) Applicant: TOPPAN INC., Tokyo (JP)

(72) Inventors: Takeshi Tamura, Tokyo (JP); Tetsuyuki Tsuchida, Tokyo (JP)

(73) Assignee: TOPPAN INC., Tokyo (JP)

( * ) Notice: Subject to any disclaimer, the term of this patent is extended or adjusted under 35 U.S.C. 154(b) by 266 days.

(21) Appl. No.: 18/134,744

(22) Filed: Apr. 14, 2023

(65) Prior Publication Data

US 2023/0254983 A1 Aug. 10, 2023

Related U.S. Application Data

(63) Continuation of application No. PCT/JP2021/036375, filed on Oct. 1, 2021.

(30) Foreign Application Priority Data

Oct. 16, 2020 (JP) .................................. 2020-174700

(51) Int. Cl.
*H05K 3/46* (2006.01)
*H05K 1/02* (2006.01)

(52) U.S. Cl.
CPC .................. *H05K 3/46* (2013.01); *H05K 1/02* (2013.01); *H05K 2201/0769* (2013.01); *H05K 2203/1338* (2013.01)

(58) Field of Classification Search
CPC ..................................... H05K 1/02; H05K 3/46
See application file for complete search history.

(56) References Cited

U.S. PATENT DOCUMENTS 8,395,056 B2 * 3/2013 Nakamura ........... H05K 3/4069
174/265
9,275,934 B2 * 3/2016 Sundaram ............. H01L 23/562
(Continued)

FOREIGN PATENT DOCUMENTS

JP 2014-225671 A 12/2014
WO WO-2018/026002 A1 2/2018
(Continued)

OTHER PUBLICATIONS

International Searching Authority, "International Search Report," issued in connection with International Patent Application No. PCT/JP2021/036375, dated Dec. 21, 2021.
(Continued)

*Primary Examiner* — Sherman Ng
(74) *Attorney, Agent, or Firm* — Foley & Lardner LLP

(57) ABSTRACT

A wiring board capable of suppressing migration between wires and to provide a method of producing the same, in a method of producing a wiring board provided with a first wiring board in which a first wiring layer is formed, and a second wiring board in which a second wiring layer finer than the first wiring layer is formed, the second wiring board is formed by performing steps of forming a first insulating resin layer provided with a wiring pattern and openings, forming a first inorganic insulating film on the first insulating resin layer, forming a first conductor layer corresponding to the wiring pattern and the openings on the inorganic insulating film, and forming a second inorganic insulating film on the first conductor layer.

7 Claims, 7 Drawing Sheets

(56) References Cited

U.S. PATENT DOCUMENTS

| | | | |
|---|---|---|---|
| 2005/0023032 A1* | 2/2005 | Kawai | H01L 23/49833 |
| | | | 428/210 |
| 2006/0191715 A1* | 8/2006 | Koyama | H05K 3/4069 |
| | | | 174/262 |
| 2009/0146314 A1* | 6/2009 | Akaike | H01L 25/16 |
| | | | 257/E23.141 |
| 2015/0060124 A1* | 3/2015 | Terui | H01L 23/5385 |
| | | | 29/831 |
| 2017/0250141 A1* | 8/2017 | Imayoshi | H05K 3/40 |
| 2021/0098354 A1* | 4/2021 | Wu | H01L 23/5385 |

FOREIGN PATENT DOCUMENTS

| | | |
|---|---|---|
| WO | WO-2018/047861 A1 | 3/2018 |
| WO | WO-2020/090601 A1 | 5/2020 |

OTHER PUBLICATIONS

International Searching Authority, "Written Opinion," issued in connection with International Patent Application No. PCT/JP2021/036375, dated Dec. 21, 2021.

* cited by examiner

WIRING BOARD AND METHOD OF PRODUCING WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/036375, filed on Oct. 1, 2021, which in turn claims the benefit of JP 2020-174700, filed Oct. 16, 2020, the disclosures of all which are incorporated herein by reference in its entirety

TECHNICAL FIELD

The present invention relates to wiring boards and methods of producing wiring boards.

BACKGROUND

In recent years, as semiconductor devices become faster and more highly integrated, FC-BGA (flip chip-ball grid array) wiring boards on which semiconductor elements are mounted are required to have narrower-pitch connection terminals to the semiconductor elements and to miniaturize wiring in the boards. However, for connection with motherboards, FC-BGA wiring boards are required to have connection terminals with pitches remaining substantially unchanged from the conventional art.

To cope with such narrowing of the connection terminal pitches to semiconductor elements and the consequent miniaturization of wiring in the FC-BGA boards, techniques of providing a multilayer wiring board including fine wiring, which is also called an interposer, between such an FC-BGA wiring board and the semiconductor elements have been used.

One of the techniques is a silicon interposer technique in which an interposer is formed on a silicon wafer using a semiconductor circuit production technique.

Also, a method of directly forming an interposer on an FC-BGA wiring board instead of forming it on a silicon wafer is being developed. In this method, the surface of an FC-BGA wiring board is flattened using CMP (chemical mechanical polishing) or the like and a multilayer wiring board serving as an interposer is directly formed on the FC-BGA wiring board. This method is disclosed in PTL 1.

There is also a method in which an interposer (multilayer wiring board) is formed on a support, such as a glass substrate, and the interposer with the support is mounted to an FC-BGA board, after which the support is separated to thereby form a narrow-pitch multilayer wiring board on the FC-BGA wiring board. This method is disclosed in PTL 2.

CITATION LIST

[Patent Literature] PTL 1: JP 2014-225671 A; PTL 2: WO 2018/047861.

SUMMARY OF THE INVENTION

Solution to Problem

Silicon interposers, which are produced using silicon wafers and equipment for front-end processes of semiconductor production, are suitable for forming fine wiring layers. However, silicon interposers are expensive because the number of interposers that can be produced from one silicon wafer is small due to such wafers being limited in shape and size and the production equipment is expensive. In addition, there is an issue that silicon wafers, which are made of semiconductor materials, tend to deteriorate in transmission characteristics.

The method of forming a multilayer wiring layer serving as an interposer on a flattened surface of an FC-BGA wiring board suffers from an issue that the productivity of the FC-BGA wiring boards is low, although the deterioration in transmission characteristics that can be seen in silicon interposers is small, and an issue that the overall productivity is low due to high difficulty of forming fine wiring on the FC-BGA wiring boards. Also, there are issues related to mounting of semiconductor elements, arising from warpage and strain of FC-BGA wiring boards.

The method of forming a multilayer wiring board on a support, such as a glass substrate, and mounting the board with the support on an FC-BGA wiring board, followed by separating the support, often uses a semi-additive method when forming a fine wiring layer on the support. Herein, a photosensitive resin layer and a wiring layer used for the fine wiring layer are formed adjacent to each other, which causes an issue that copper as a wiring layer material diffuses into the photosensitive resin layer in high temperature and humidity environment testing or the like, causing migration (which is also referred to as electromigration) in which adjacent wires become electrically connected to each other.

The present invention has been made in light of the above issues and aims to provide a wiring board capable of suppressing migration between wires and to provide a method of producing the wiring board.

Solution to Problem

In order to solve the above issues, in a typical wiring board of the present invention including a first wiring board in which a first wiring layer is formed, and a second wiring board in which a second wiring layer finer than the first wiring layer is formed, the second wiring board having a first surface to which the first wiring board is bonded and a second surface to which semiconductor elements can be mounted,
  an inorganic insulating film is formed between the second wiring layer and an insulating resin layer in the second wiring board.

Furthermore, in a typical method of producing a wiring board of the present invention including a first wiring board in which a first wiring layer is formed, and a second wiring board in which two or more second wiring layers finer than the first wiring layer are formed, the second wiring board having a first surface to which the first wiring board is bonded and a second surface to which semiconductor elements can be mounted,
  the step of producing the second wiring board includes steps of:
  forming a first insulating resin layer provided with a wiring pattern and openings corresponding to the second wiring layers;
  forming a first inorganic insulating film on the first insulating resin layer;
  forming a first conductor layer corresponding to the wiring pattern and the openings on the first inorganic insulating film; and forming a second inorganic insulating film on the first conductor layer.

Advantageous Effects of the Invention

According to the present invention, a wiring board capable of suppressing migration between wires and a method of producing the wiring board can be provided.

Issues, configurations, and advantageous effects other than those described above will be clarified in the following description for embodiments.

DETAILED DESCRIPTION

Figure 1:
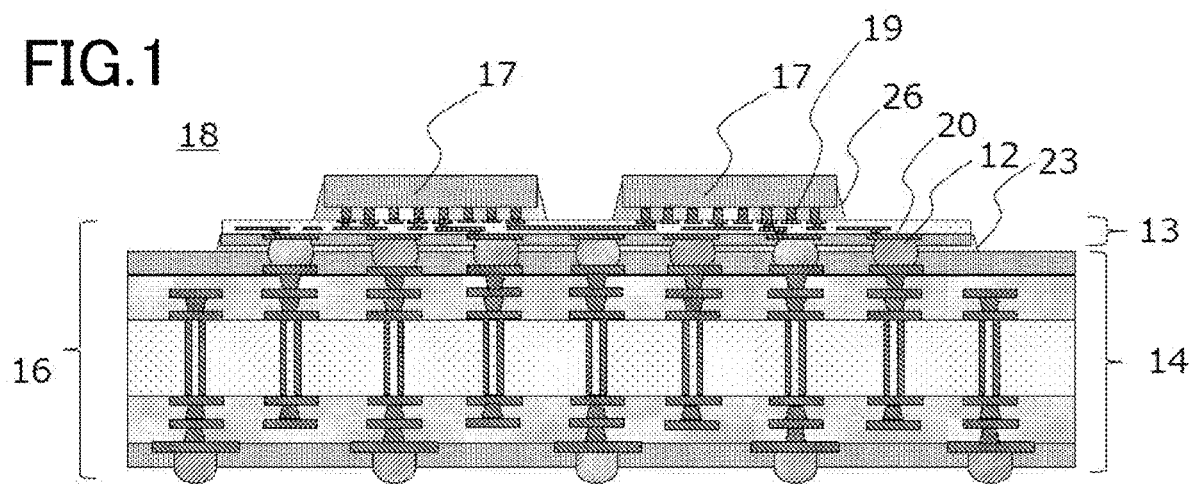
FIG. 1 is a cross-sectional view illustrating a semiconductor device using a wiring board on which semiconductor elements are mounted as shown.

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

Referring to the drawings, some embodiments of the present invention will be described. In the following description of the drawings, components identical with or similar to each other are given the same or similar reference signs. It should be noted that the drawings are only schematically illustrated, and thus the relationship between thickness and planar dimensions of the components, the thickness ratio between the layers, and the like are not to scale. Accordingly, specific thicknesses or dimensions should be understood referring to the following description. As a matter of course, dimensional relationships or ratios may be different between the drawings.

The embodiment described below only exemplifies a device or a method embodying the technical idea of the present invention. The technical idea of the present invention should not limit the materials, shapes, structures, layouts, and the like of the components to those described below. The technical idea of the present invention can be modified in various ways within the technical scope defined in the claims.

In the present disclosure, the term "surface" may refer to not only the surface of a plate-like member but also, for a layer included in the plate-like member, an interface with the layer that is substantially parallel to the surface of the plate-like member. The term "upper surface" or "lower surface" refers to a surface shown in the upward direction or downward direction in a drawing when a plate-like member or a layer included in the plate-like member is shown in the drawing.

The term "side surface" refers to a thickness portion of a plate-like member, or a thickness portion of a surface of a layer included in the plate-like member. Furthermore, a part of a surface and a side surface may be collectively referred to as an "end portion".

The term "above" refers to the vertically upward direction when a plate-like member or a layer is horizontally placed. The term "above" and the term "below" that is opposite to above may be referred to as "Z-axis direction", and the horizontal direction may be referred to as "X-axis direction" or "Y-axis direction".

The term "planar shape" or "in plan view" refers to a shape when a surface or a layer is seen from above. The term "cross-sectional shape" or "cross-sectional view" refers to a shape as seen in a horizontal direction when a plate-like member or a layer is sectioned in a specific direction.

The term "center portion" refers to an intermediate portion that is not a peripheral portion of a surface or a layer. The term "inward direction" refers to a direction toward a center of a surface or a layer in a planar shape, from a peripheral portion of the surface or the layer.

(Configuration of Wiring Board)

A wiring board 16 of the present embodiment is formed by bonding a second wiring board (interposer) 13 to an FC-BGA board (also termed first wiring board) 14. First, a semiconductor device 18 produced using the wiring board 16 of the present embodiment, as shown in FIG. 1, will be described in its entirety.

In FIG. 1, the second wiring board 13 can be connected, on a first surface (upper surface) thereof, to semiconductor elements 17, and is bonded, on a second surface (lower surface) thereof, to the FC-BGA board 14 to integrally form the semiconductor device 18. Two or more wiring layers (also termed second wiring layers) forming the second wiring board 13 are finer than wiring layers (also termed first wiring layers) forming the FC-BGA board 14, and have a wiring interval of, for example, 0.5 µm to 5.0 µm between adjacent wires. Therefore, it is necessary to suppress migration, the detail of which will be described layer.

The second wiring board 13 is connected to the semiconductor elements 17 via chip connection terminals 19 and then sealed and fixed with a sealing resin 26. The second wiring board 13 is connected to the FC-BGA board 13 via connection terminals 20 and solder joints 12 and then sealed and fixed with a sealing resin 23.

As will be described later, the second wiring board 13 is formed above a support (carrier substrate) 1 via a release layer 2 and bonded to the FC-BGA board 14 together with the support 1 and then the support 1 is separated at the release layer 2 and removed.

The semiconductor elements 17 may be bonded to the second wiring board 13 after or before the second wiring board 13 is bonded to the FC-BGA board 14. The following description of the present embodiment explains a mode in which the semiconductor elements 17 are bonded to the wiring board 16 after the second wiring board 13 is bonded to the FC-BGA board 14.

(Method of Producing Wiring Board)

Referring to FIGS. 2 to 23, an example will be given of a production procedure of a wiring board using a support, according to the present embodiment.

(1) Formation of Release Layer on Support

Figure 2:
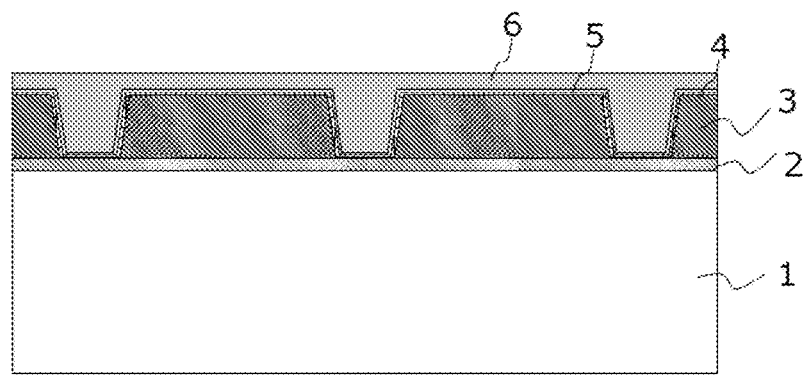
FIG. 2 is a cross-sectional view illustrating a state in which a release layer, a photosensitive resin layer, a seed adhesion layer, a seed layer, and a conductor layer are formed on a support.

First, as shown in FIG. 2, a release layer 2 which is necessary for separating the support 1 in a later step is formed on one surface of the support 1.

The release layer 2 may be formed of, for example, a resin which becomes separable due to heat generation by absorbing light such as UV light or due to alteration, or a resin which becomes separable due to foaming by heat. If a resin that becomes separable due to light such as UV light, e.g., laser light, is used, the support 1 can be removed from the bonded body of the second wiring board 13 on the support 1 and the FC-BGA board 14 by applying light to the support 1 from the surface thereof facing away from the surface provided with the release layer 2.

The material of the release layer 2 can be selected, for example, from organic resins such as epoxy resins, polyimide resins, polyurethane resins, silicone resins, polyester resins, oxetane resins, maleimide resins, and acrylic resins, or from inorganic layers such as an amorphous silicon layer, a gallium nitride layer, and metal oxide layers. The material of the release layer 2 may contain additives such as photolysis accelerants, light absorbers, sensitizers, and fillers. The release layer 2 may be formed of a plurality of layers. For example, a protective layer may be provided on the release layer 2 for the purpose of protecting the multilayer wiring layer formed on the support 1, or a layer that enhances adhesion to the support 1 may be provided as an underlayer of the release layer 2. Furthermore, a laser light reflective layer or a metal layer may be provided between the release layer 2 and the multilayer wiring layer, and thus the structure of the release layer 2 should not be limited by the present embodiment.

The support 1 is preferred to have transparency, e.g., may be formed using glass, because the release layer 2 may be irradiated with light via the support 1. Glass has excellent flatness and high rigidity and therefore is suitable for the wiring board on the support to form fine patterns. In addition, glass has a low CTE (coefficient of thermal expansion) and is resistant to strain and therefore is excellent in securing pattern placement accuracy and flatness.

If glass is used as the support 1, the thickness of the glass is preferred to be large, e.g., 0.5 mm or more, and more preferred to be 1.2 mm or more, from the perspective of suppressing the occurrence of warpage in the production processes. Furthermore, the CTE of the glass is preferred to be 3 ppm or more and 16 ppm or less, and is more preferred to be about 10 ppm from the perspective of the CTEs of the FC-BGA wiring board 14 and the semiconductor elements 17.

Examples of the glass include quartz glass, borosilicate glass, non-alkali glass, soda glass, and sapphire glass. However, if the support 1 is not required to have transparency when separating the support 1, such as the case where a resin that foams due to heat is used as the release layer 2, the support 1 can be formed using metal or ceramics, for example, inducing less strain. In the present embodiment, a resin that becomes separable due to absorption of UV light is used as the release layer 2, and glass is used as the support 1.

(2) Formation of Photosensitive Resin Layer on Upper Surface of Release Layer

Next, a photosensitive resin layer 3 that is an insulating resin layer is formed on the release layer 2. The photosensitive resin layer 3 of the present embodiment is formed, for example, by spin-coating a photosensitive epoxy resin. Photosensitive epoxy resins can be cured at relatively low temperatures, and are less likely to shrink due to curing after formation, and thus are excellent in fine pattern formation thereafter.

The method of forming a photosensitive resin in the case of using a liquid photosensitive resin can be selected from slit coating, curtain coating, die coating, spray coating, electrostatic coating, inkjet coating, gravure coating, screen printing, gravure offset printing, spin coating, and doctor coating. In the case of using a film-like photosensitive resin, lamination, vacuum lamination, vacuum pressing, or the like can be applied.

For the photosensitive resin layer 3, for example, a photosensitive polyimide resin, photosensitive benzocyclobutene resin, photosensitive epoxy resin, or derivatives thereof can be used as an insulating resin. Next, large-diameter openings are provided to the photosensitive resin layer 3 using photolithography. The large-diameter openings may be subjected to plasma treatment for the purpose of removing residues produced during development. The thickness of the photosensitive resin layer 3 is determined according to the thickness of the conductor layer portions formed in the large-diameter openings, and is determined to be 8 µm, for example, in the present embodiment. The shape of the large-diameter openings in plan view is determined according to the pitch and shape of the junction electrodes of the semiconductor elements. In the present embodiment, the large-diameter openings are formed with a diameter, for example, of φ25 µm and at the pitch of 55 µm.

(3) Formation of Seed Adhesion Layer and Seed Layer

Next, a seed adhesion layer 4 and a seed layer 5 are formed in a vacuum. The seed adhesion layer 4 enhances adhesion of the seed layer 5 to the photosensitive resin layer 3 and prevents separation of the seed layer 5 therefrom. The seed layer 5 serves as a power supply layer for electroplating when forming wiring.

The seed adhesin layer 4 and the seed layer 5 are formed, for example, using sputtering or vapor deposition, and using, for example, Cu, Ni, Al, Ti, Cr, Mo, W, Ta, Au, Ir, Ru, Pd, Pt, AlSi, AlSiCu, AlCu, NiFe, ITO, IZO, AZO, ZnO, PZT, TiN, $Cu_3N_4$, or a Cu alloy, or combinations thereof. In the present embodiment, a titanium layer as the seed adhesion layer 4 and a copper layer as the seed layer 5 are sequentially formed using sputtering, from the perspective of electrical characteristics, ease of production, and cost. The total thickness of the titanium layer and the copper layer is preferred to be 1 µm or less as a power supply layer for electroplating. In the present embodiment, Ti: 50 nm and Cu: 300 nm are formed.

(4) Formation of Conductor Layer

Next, a conductor layer 6 is formed using electroplating. The conductor layer 6 serves as electrodes for bonding to the semiconductor elements 17. Nickel electroplating, copper electroplating, chromium electroplating, Pd electroplating, gold electroplating, rhodium electroplating, iridium electroplating, or the like can be used; however, from the perspective of ease, cost, and electrical conductivity, copper electroplating is preferred. The thickness of the copper electroplating is preferred to be 1 µm or more from the perspective of serving as electrodes for bonding to the semiconductor elements 17 and solder bonding, and is preferred to be 30 µm or less from the perspective of productivity. In the present embodiment, Cu: 10 µm is formed in the openings of the photosensitive resin layer 3, and Cu: 2 µm is formed on the photosensitive resin layer 3.

Through the steps described above, a structure as shown in FIG. 2 can be obtained. The following steps are further performed.

(5) Polishing of Conductor Layer

Figure 3:
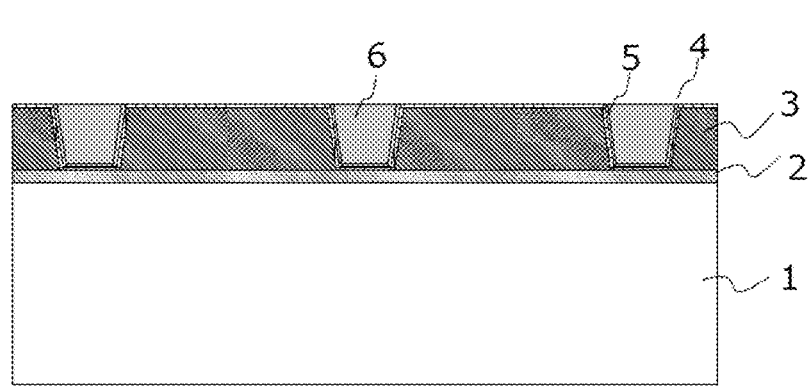
FIG. 3 is a cross-sectional view illustrating a state in which the conductor layer and the seed layer are polished using surface polishing.

Next, as shown in FIG. 3, the copper layer is polished using CMP (chemical mechanical polishing) processing or the like to remove unnecessary conductor layer 6 portions and seed layer 5 portions. Thus, the polishing processing can be performed so that the seed adhesion layer 4 portions and the conductor layer 6 portions can form a surface. In the present embodiment, Cu: 2 µm of the conductor layer 6 and Cu: 300 nm of the seed layer 5 on the photosensitive resin layer 3 are polished away.

Figure 4:
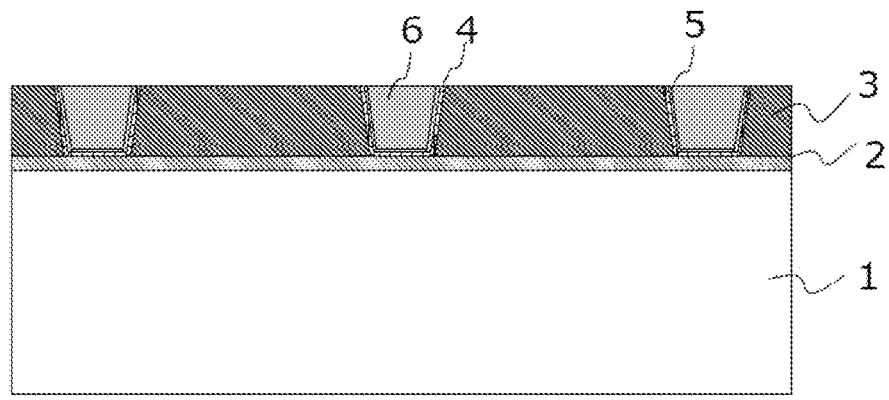
FIG. 4 is a cross-sectional view illustrating a state in which the seed adhesion layer and the photosensitive resin layer are polished using surface polishing to form electrodes for bonding to semiconductor elements.

(6) Removal of Seed Adhesion Layer Portions and Photosensitive Resin Layer Portions Next, as shown in FIG. 4, unnecessary seed adhesion layer 4 portions and photosensitive resin layer 3 portions are removed using polishing such as CMP processing again. Since the polishing is performed for the different materials of the seed adhesion layer 4 and the photosensitive resin layer 3, chemical polishing is less effective but physical polishing using an abrasive is effective. However, a method similar to the polishing described referring to FIG. 3 may be used, for the purpose of simplifying the processing, or a different polishing method may be used between the seed adhesion layer 4 and the photosensitive resin layer 3 according to the type of the material, for the purpose of polishing efficiency. Thus, the conductor layer 6 portions remaining after the polishing serve as electrodes for bonding to the semiconductor elements 17.

(7) Formation of Inorganic Insulating Film

Figure 5:
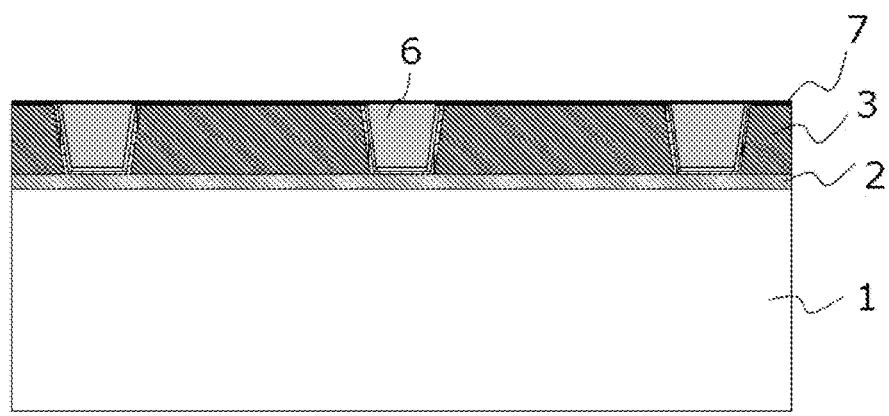
FIG. 5 is a cross-sectional view illustrating a state in which an inorganic insulating film is formed.

Next, as shown in FIG. 5, an inorganic insulating film 7 is formed over the upper surfaces of the conductor layer 6 portions, the photosensitive resin layer 3, and the like. As the inorganic insulting film 7, a silicon oxide film (SiOx), silicon nitride film (SiNx), or films of SiC, SiOF, SiOC, and the like may be used. The thickness of the inorganic insulating film 7 is preferred to be 20 nm to 200 nm. In the present embodiment, SiNx (thickness: 50 nm) is used as the inorganic insulating film 7. This film is formed using a plasma CVD method with which a dense film can be formed at comparatively low temperatures.

However, the inorganic insulating film 7 does not necessarily have to be an insulating film, such as the above silicon oxide film (SiOx), silicon nitride film (SiNx), etc., which is formed using a plasma CVD method, that is, the type and method should not be limited as long as the film is an inorganic insulating film.

(8) Formation of Photosensitive Resin Layer

Figure 6:
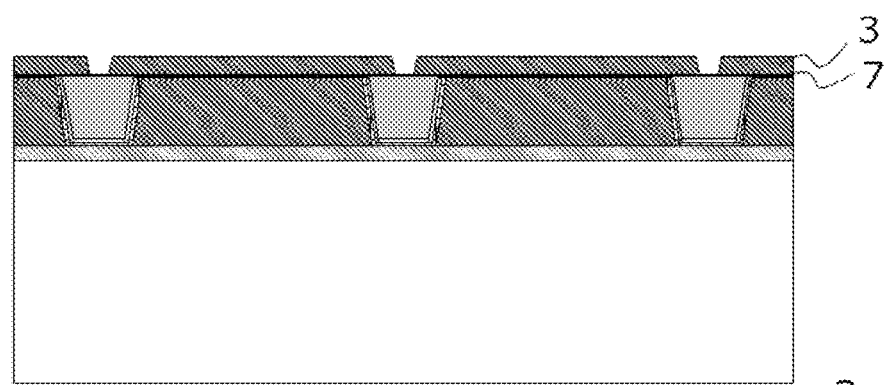
FIG. 6 is a cross-sectional view illustrating a state in which a photosensitive resin layer for vias is formed.

Next, as shown in FIG. 6, a photosensitive resin layer 3 provided with small-diameter openings is formed on the upper surface using a method similar to the above method. The thickness of the photosensitive resin layer 3 is determined according to the thickness of the conductor layer portions formed in the small-diameter openings, and is determined to be 2 μm, for example, in the present embodiment. The shape of the small-diameter openings in plan view is determined from the perspective of connection to the conductor layer 6 portions. In the present embodiment, the small-diameter openings are formed with a diameter, for example, of φ11 μm. These small-diameter openings have a shape of a via connecting between the overlayer and the underlayer of the multilayer wiring.

Also, as shown in FIG. 6, since the inorganic insulating film 7 is interposed at the interface between photosensitive resin layers 3, adhesion therebetween is enhanced compared to the case where a photosensitive resin layer 3 is directly formed on another photosensitive resin layer 3. Furthermore, since the inorganic insulating film 7 is interposed between a photosensitive resin layer 3 and the conductor layer 6 portions, adhesion therebetween is enhanced compared to the case where conductor layer 6 portions are directly in contact with a photosensitive resin layer 3.

Figure 7:
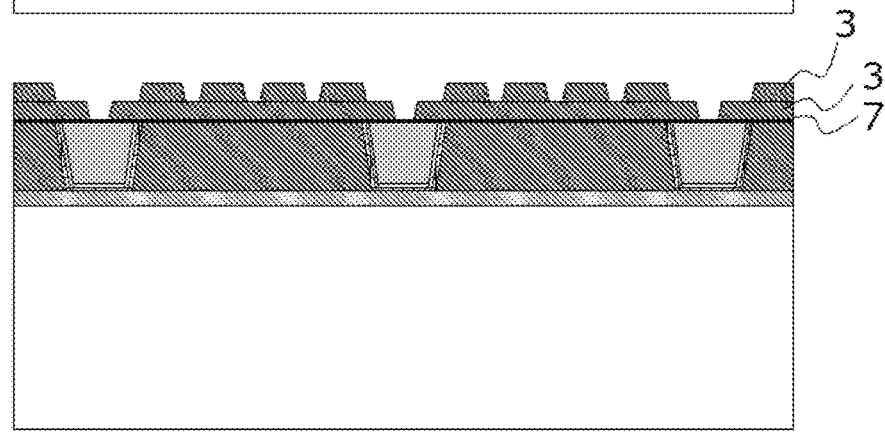
FIG. 7 is a cross-sectional view illustrating a state in which a photosensitive resin layer for vias and wiring parts is formed.

As shown in FIG. 7, another photosensitive resin layer 3 provided with large-diameter openings aligning the small-diameter openings of the underlayer and also provided with a wiring pattern on the upper surface thereof is formed using a method similar to the above method. The thickness of this photosensitive resin layer 3 is determined according to the thickness of the conductor layer portions formed in the large-diameter openings, and is determined to be 2 μm, for example, in the present embodiment. The shape of the large-diameter openings in plan view is determined from the perspective of connectivity to a laminate. Thus, the large-diameter openings are formed enclosing the outer side of the respective small-diameter openings of the underlayer. In the present embodiment, the large-diameter openings are formed with a diameter, for example, of φ25 μm. The large-diameter openings serve as wiring parts of the multilayer wiring and, if the number of layers is increased, serve as receiving pads, i.e., lands, for respective vias. In the present embodiment, the vias for connecting between layers are integrally formed together with the lands in a single batch process. As shown, the wiring parts forming the wiring pattern of the photosensitive resin layer 3 each have an isosceles trapezoidal shape in which the lower base is smaller than the upper base.

(9) Formation of Inorganic Insulating Film

Figure 8:
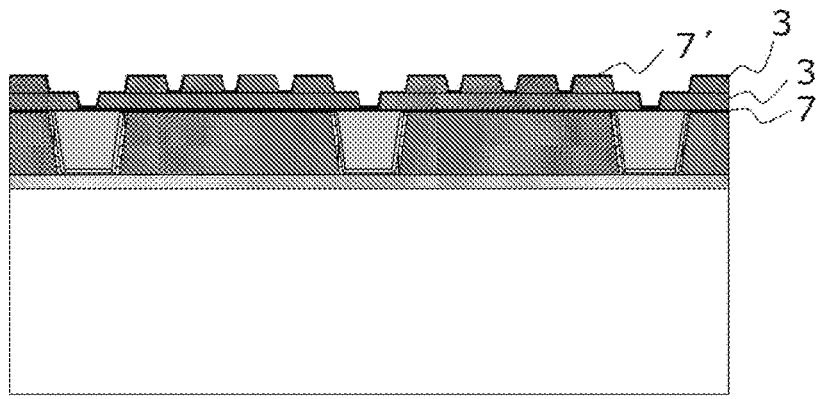
FIG. 8 is a cross-sectional view illustrating a state in which an inorganic insulating film for vias and wiring parts is formed.

Next, as shown in FIG. 8, an inorganic insulating film 7' is formed covering the upper surface of the photosensitive resin layer 3 and the inside of the openings of the photosensitive resin layers 3. As the inorganic insulting film 7', a silicon oxide film (SiOx), silicon nitride film (SiNx), or films of SiC, SiOF, SiOC, and the like may be used, similarly to the inorganic insulating film 7. The thickness of the inorganic insulating film 7' is preferred to be 20 nm to 200 nm. In the present embodiment, SiNx (thickness: 50 nm) is used as the inorganic insulating film 7'. This film is formed using a plasma CVD method with which a dense film can be formed at comparatively low temperatures.

(10) Formation of Openings in Inorganic Insulating Film

Figure 9:
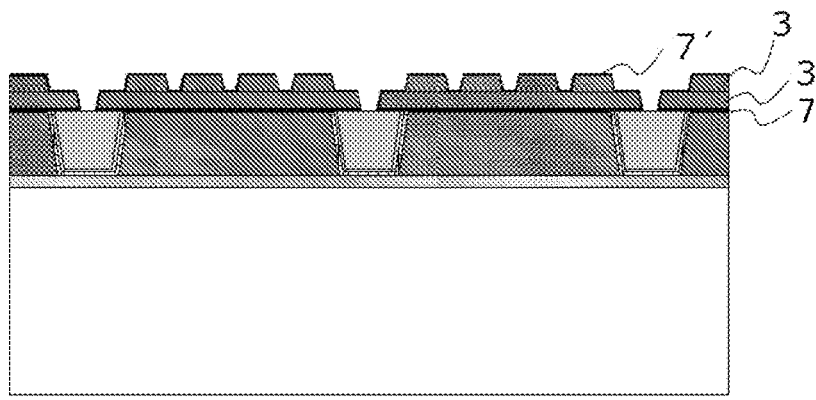
FIG. 9 is a cross-sectional view illustrating a state in which inorganic insulating film portions in the vias are removed.

Next, as shown in FIG. 9, the inorganic insulating film 7' portions covering the conductor layer 6 portions inside the small-diameter openings of the photosensitive resin layer 3 are removed by performing, for example, dry etching in a vacuum. In other words, openings are formed in the inorganic insulating film 7' to expose the bottoms of the small-diameter openings of the photosensitive resin layer 3, so that, in a step described layer, vias are formed using the conductor layer 6 portions formed inside the openings.

(11) Formation of Seed Adhesion Layer and Seed Layer

Figure 10:
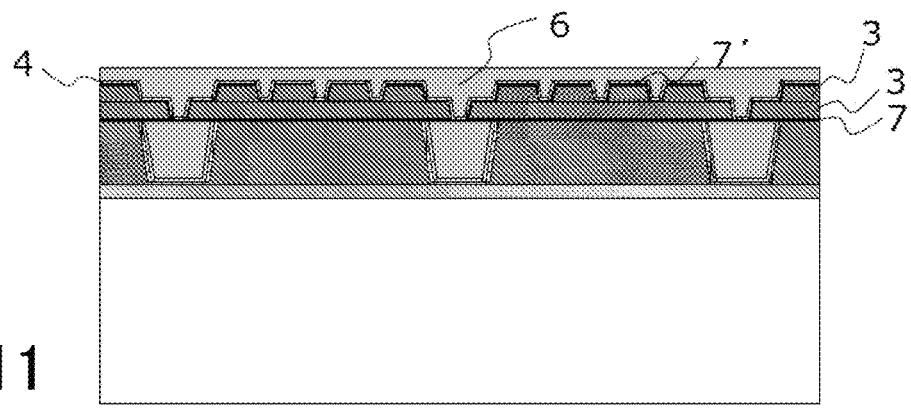
FIG. 10 is a cross-sectional view illustrating a state in which a seed adhesion layer, a seed layer, and a conductor layer are formed similarly to the above.

Next, a seed adhesion layer 4 and a seed layer 5 are formed in a vacuum using a method similar to the method described above, and further, a conductor layer 6 is formed using electroplating that is a method similar to the method shown in FIG. 2. In the present embodiment, the seed adhesion layer 4 is made of Ti: 50 nm, the seed layer 5 is made of Cu: 300 nm, and the conductor layer 6 is made of Cu: 6 μm. This state is shown in FIG. 10 in which, however, the seed layer 5 is omitted because the seed layer 5 and the conductor layer 6 are made of the same material. The conductor layer 6 serves as vias and wiring parts.

(12) Removal of Conductor Layer Portions and Seed Layer Portions

Figure 11:
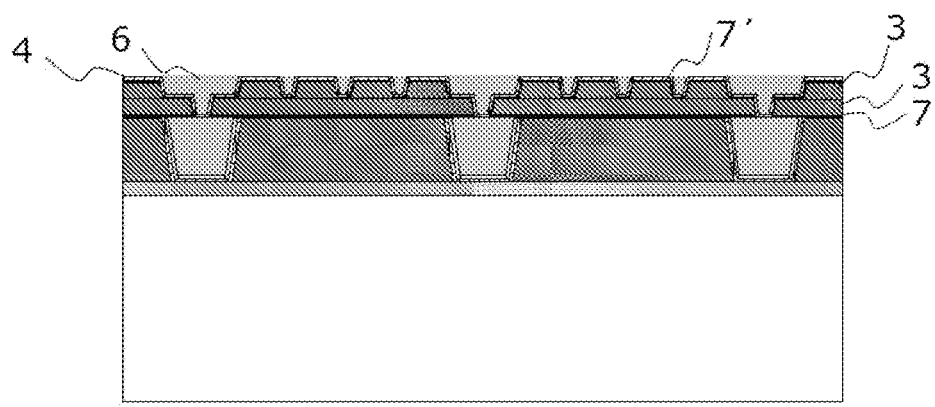
FIG. 11 is a cross-sectional view illustrating a state in which vias and wiring parts are formed using surface polishing.

As shown in FIG. 11, unnecessary conductor layer 6 portions and seed layer 5 portions are removed using polishing, such as CMP (chemical mechanical polishing) processing. In this case, the side walls of the photosensitive resin layer 3, which are covered with the inorganic insulating film 7', are provided with the seed adhesion layer 4. By forming the seed adhesion layer 4 as a continuous film on the side walls of the photosensitive resin layer 3 via the inorganic insulating film 7', the risk of disconnection between the vias and the lands due to warpage can be reduced.

Figure 12:
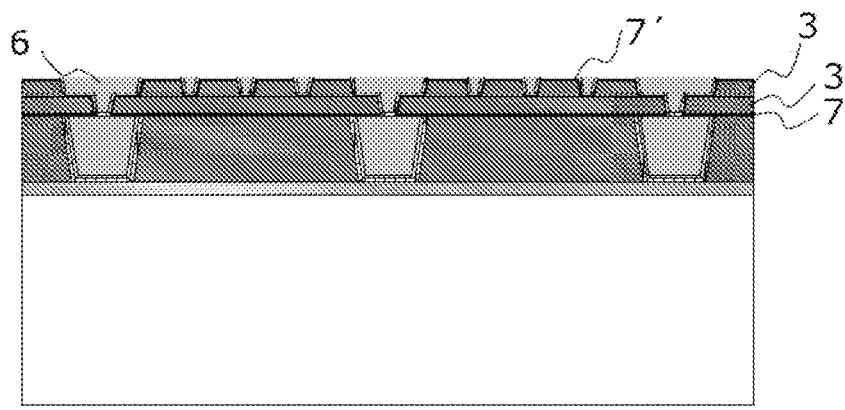
FIG. 12 is a cross-sectional view illustrating a state in which the seed adhesion layer and the photosensitive resin layer are polished using surface polishing to form interlayer connection conductors.

(13) Removal of Seed Adhesion Layer Portions and Photosensitive Resin Layer Portion Subsequently, as shown in FIG. 12, unnecessary seed adhesion layer 4 portions and photosensitive resin layer 3 portions are removed, with the inorganic insulating film 7' substantially remaining, using polishing such as CMP (chemical mechanical polishing) processing again. Thus, the conductor layer 6 portions remaining after the CMP processing or the like serve as conductors for the vias and wiring parts. In the present embodiment, Cu: 2 μm of the conductor layer 6 and Cu: 300 nm of the seed layer 5 on the photosensitive resin layer 3 are polished away. Thus, an interlayer connection conductor layer in which vias are integrated with respective lands can be formed.

(14) Formation of Inorganic Insulating Film

Figure 13:
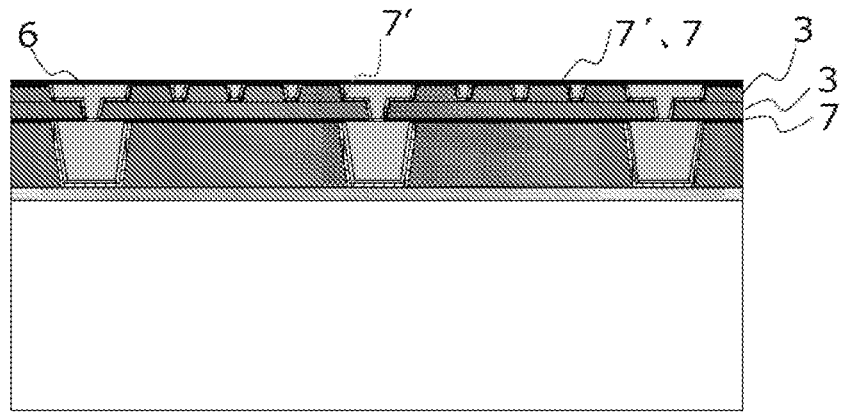
FIG. 13 is a cross-sectional view illustrating a state in which an inorganic insulating film is formed.
Figure 14:
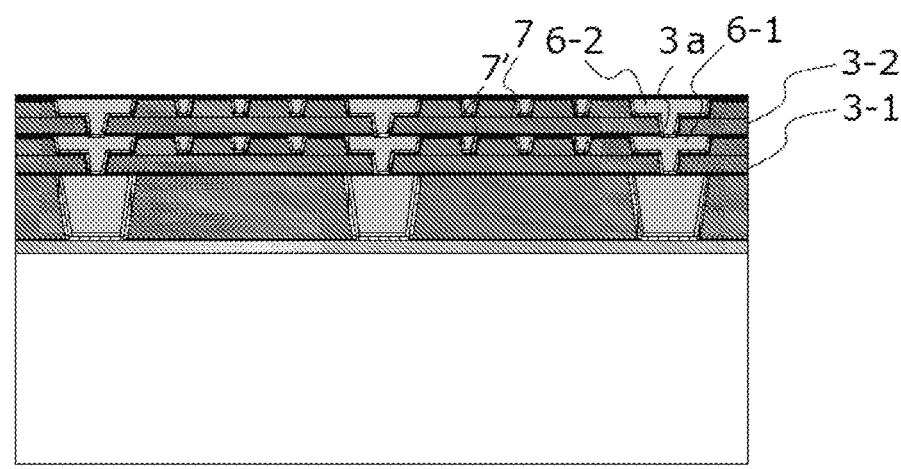
FIG. 14 is a cross-sectional view illustrating a state in which multilayer wiring is formed repeating the steps shown in FIGS. 6 to 13.

Next, as shown in FIG. 13, an inorganic insulating film 7 is formed on the remaining inorganic insulating film 7'. As the inorganic insulting film 7, a silicon oxide film (SiOx), silicon nitride film (SiNx), or films of SiC, SiOF, SiOC, and the like may be used. The thickness of the inorganic insulating film 7 is preferred to be 20 nm to 200 nm. In the present embodiment, SiNx (thickness: 50 nm) is used as the inorganic insulating film 7. This film is formed using a plasma CVD method with which a dense film can be formed at comparatively low temperatures. Thus, the conductor layer 6 portions are enclosed by the photosensitive resin layer 3, with the inorganic insulating film 7' interposed between the photosensitive resin layer 3 below and around each conductor layer 6 portion, and the corresponding conductor layer 6 portion. Further, as shown in FIG. 14, when lamination proceeds further, the inorganic insulating films 7, 7' are interposed between the photosensitive resin layer 3 above each conductor layer 6 portion and the corresponding conductor layer 6 portion. Thus, the second wiring layer formed of the conductor layer 6 portions is covered with the inorganic insulating films 7, 7' in all directions, up, down, left, and right to prevent migration in high temperature and humidity testing or the like.

(15) Formation of Multilayer Wiring

Repeating the steps of FIGS. 6 to 13, multilayer wiring in which two or more conductor layers 6 are laminated is formed. Specifically, a step of forming a first photosensitive resin layer 3-1 (termed first insulating resin layer) provided with a wiring pattern and openings corresponding to the second wiring layer (FIGS. 6 and 7), a step of forming the inorganic resin film 7' (termed first inorganic insulating film) on the first insulating resin layer (FIG. 8), a step of forming a first conductor layer 6-1 (termed first conductor layer) corresponding to the wiring pattern and the openings on the first inorganic insulating film (FIGS. 10 and 11), and a step of forming the inorganic insulating film 7 (termed second inorganic insulating film) on the first conductor layer (FIG. 13) are performed.

Furthermore, a step of forming a second photosensitive resin layer 3-2 (termed second insulating resin layer) provided with a wiring pattern and openings on the second inorganic insulating film, a step of forming openings in the second inorganic insulating film in a vacuum using dry etching, for example, aligning the openings of the second insulating resin layer (FIG. 9), and a step of forming a second conductor layer 6-2 (termed second conductor layer) electrically connected to the first conductor layer via the openings of the second inorganic insulating film, are performed using methods similar to the methods described above. Thus, a structure as shown in FIG. 14 can be obtained.

In the present embodiment, as shown in FIG. 14, a laminate of second wiring layers are formed, which is formed of two layers of the conductor layers 6 portions each having an isosceles trapezoidal shape in which the lower base is smaller than the upper base. In order to electrically connect the laminated second wiring layers to each other, vias 3a are formed using the openings of the photosensitive resin layers 3 adjacent to the respective conductor layers 6 to thereby form interlayer connection conductor layer portions in the respective vias 3a. The second wiring layers can be electrically connected to each other by forming openings in the inorganic insulating films 7, 7' in the vias 3a.

As shown in FIG. 14, the upper and lower surfaces of each photosensitive resin layer 3 are each covered with the inorganic insulating films 7, 7'.

(16) Formation of Photosensitive Resin Layer

Figure 15:
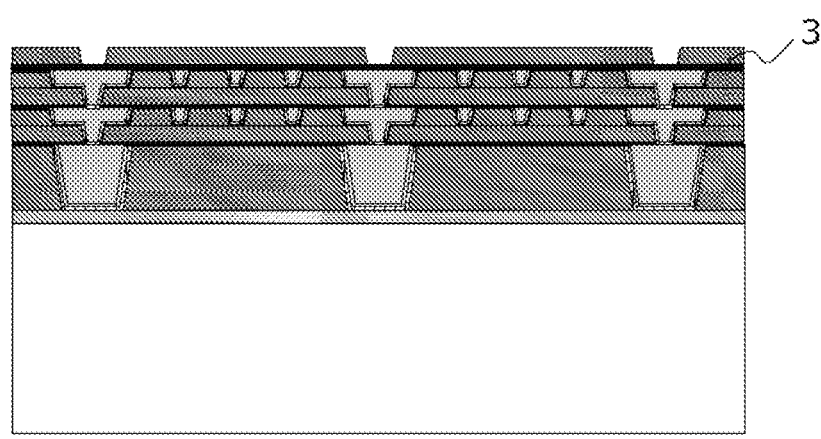
FIG. 15 is a cross-sectional view illustrating a state in which a photosensitive resin layer is formed.

Next, as shown in FIG. 15, a photosensitive resin layer 3 is formed on the upper surface.

Figure 16:
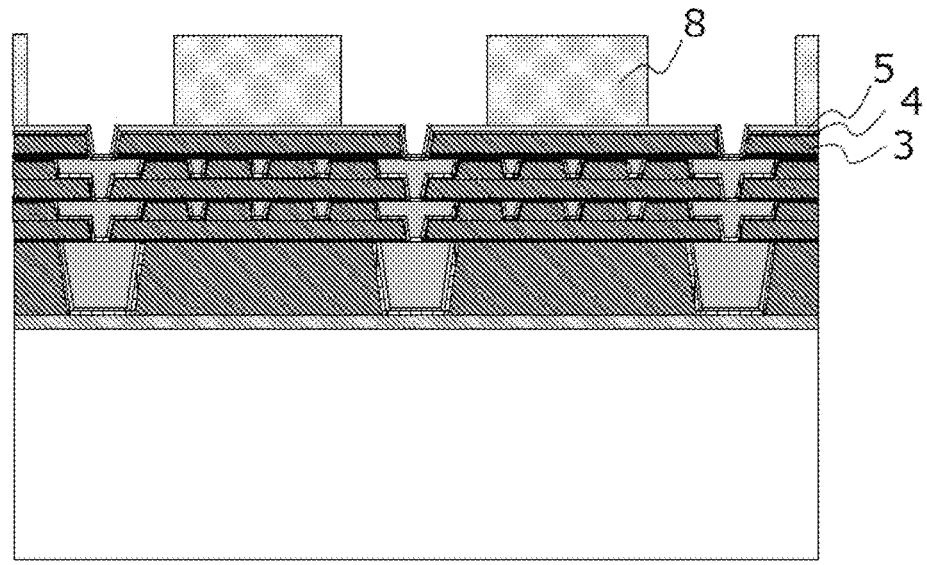
FIG. 16 is a cross-sectional view illustrating a state in which the inorganic insulating film portions in the vias are removed, with a seed adhesion layer, a seed layer, and a resist pattern formed similarly to the underlayer.

(17) Removal of Inorganic Insulating Film Portions and Formation of Resist Pattern Next, as shown in FIG. 16, the inorganic insulating film 7 portions in the openings of the photosensitive resin layer 3 are removed using dry etching that is a method similar to the method shown in FIG. 9. After that, a seed adhesion layer 4 and a seed layer 5 are formed in a vacuum using a method similar to the method described above, and further, a resist pattern 8 is formed.

(18) Formation of Electrodes

Figure 17:
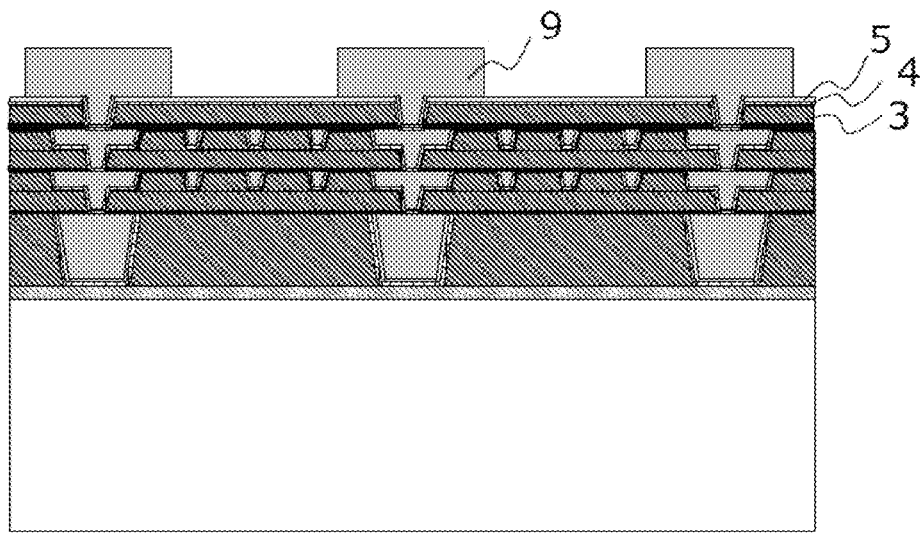
FIG. 17 is a cross-sectional view illustrating a state in which conductor layer portions are formed and the resist pattern is removed.

Next, as shown in FIG. 17, conductor layer (for solder bonding) 9 portions are formed using electroplating. The conductor layer (for solder bonding) 9 portions serve as electrodes to which the FC-BGA board 14 is bonded. The thickness of copper electroplating is preferred to be 1 μm or more from the perspective of solder bonding, and is preferred to be 30 μm or less from the perspective of productivity. In the present embodiment, Cu: 10 μm is formed in the openings of the photosensitive resin layer 3, and Cu: 8 μm is formed on the photosensitive resin layer 3. After that, the resist pattern 8 is removed.

(19) Removal of Seed Adhesion Layer Portions and Seed Layer Portions

Figure 18:
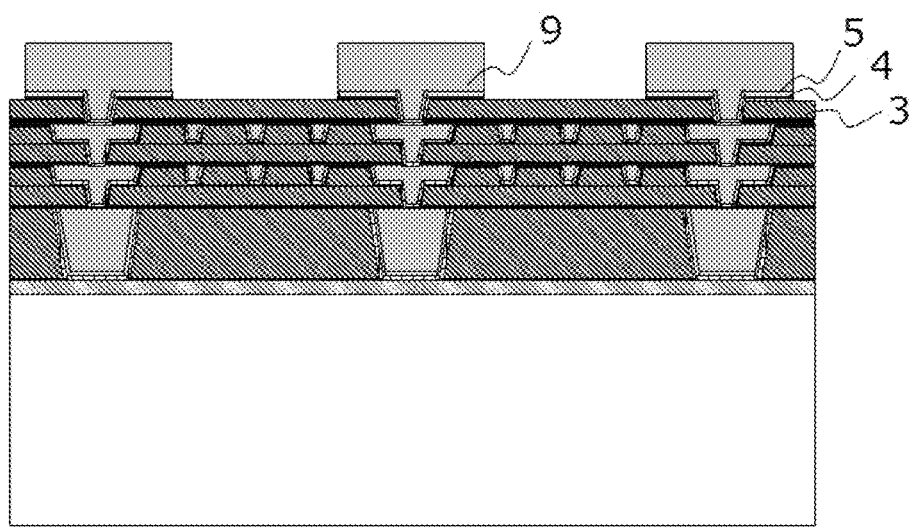
FIG. 18 is a cross-sectional view illustrating a state in which unnecessary seed adhesion layer portions and seed layer portions are etched away.

Next, as shown in FIG. 18, unnecessary seed adhesion layer 4 portions and seed layer 5 portions are etched away.

(20) Formation of Solder Resist Layer

Figure 19:
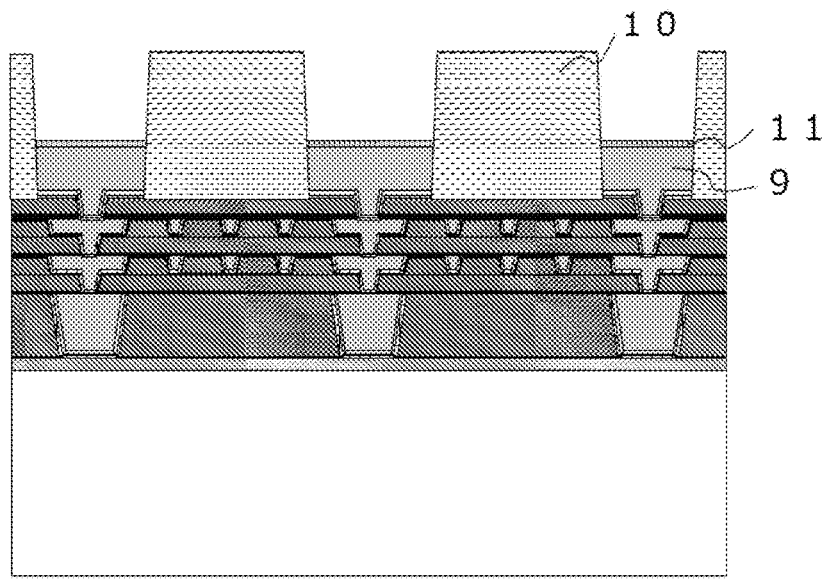
FIG. 19 is a cross-sectional view illustrating a state in which a solder resist layer and surface treatment layer portions are formed.

Next, as shown in FIG. 19, a solder resist layer 10 is formed. The solder resist layer 10 is formed covering the photosensitive resin layer 3 by exposure and development so as to provide openings in which the conductor layer (for solder bonding) 9 portions are exposed. As materials for the solder resist layer 10, for example, insulating resins such as epoxy resins and acrylic resins can be used. In the present embodiment, the solder resist layer 10 is formed using a photosensitive epoxy resin containing a filler.

Furthermore, surface treatment layer 11 portions are provided to prevent oxidation of the surfaces of the conductor layer (for solder bonding) 9 portions and enhance wettability of solder bumps. In the present embodiment, the surface treatment layer 11 portions are formed using Ni/Pd/Au electroless plating. It should be noted that OSP (surface treatment using organic solderability preservative water-soluble preflux) film portions may be formed as the surface treatment layer 11 portions. Plating may be appropriately selected from tin electroless plating, Ni/Au electroless plating, and other electroplating methods according to usage.

(21) Formation of Solder Joints

Figure 20:
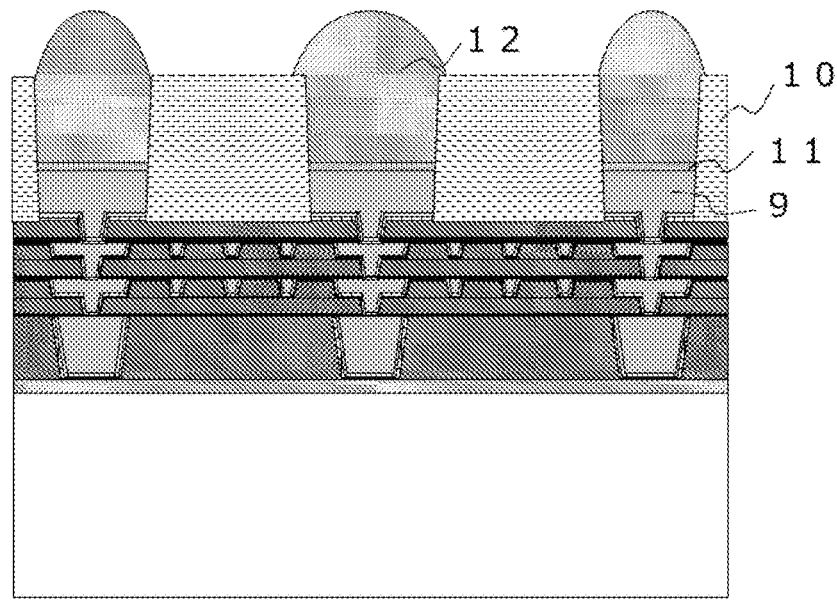
FIG. 20 is a cross-sectional view illustrating a state in which solder joints are formed to complete a wiring board on the support.

Next, as shown in FIG. 20, a solder material is placed on the surface treatment layer 11 portions, followed by melting and cooling for fixture to thereby form solder joints 12 on the conductor layer 9 portions via the respective surface treatment layer 11 portions. Thus, a second wiring board 13 on the support 1 is completed.

(22) Bonding Between Wiring Board and FC-BGA Board

Figure 21:
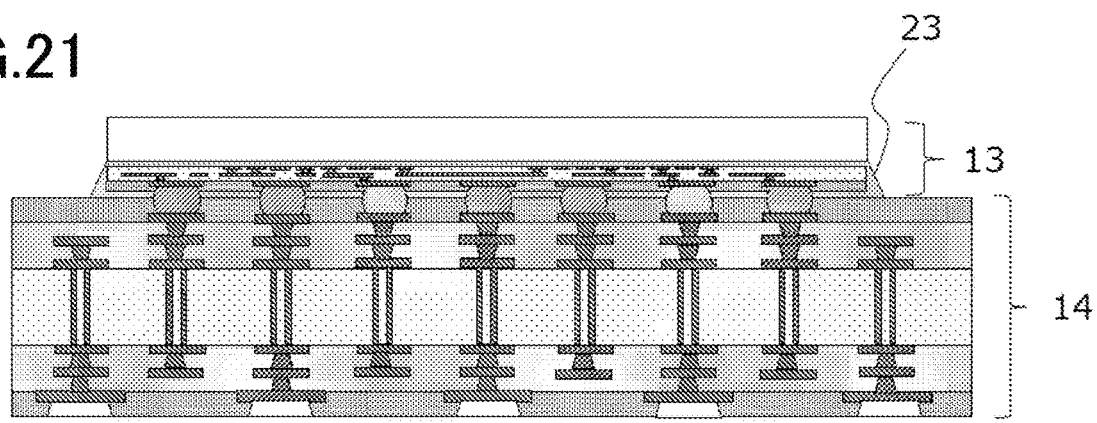
FIG. 21 is a cross-sectional view illustrating a state in which the wiring board on the support and an FC-BGA board are bonded together and sealed with an underfill layer.

Next, as shown in FIG. 21, the second wiring board 13 on the support is bonded to the FC-BGA board 14, and then the joints are sealed with an underfill layer (sealing resin 23). The underfill layer is formed using, for example, a resin that is a mixture of one or more resins from an epoxy resin, urethane resin, silicone resin, polyester resin, oxetane resin, and maleimide resin, with an addition of silica, titanium oxide, aluminum oxide, magnesium oxide, zinc oxide or the like as a filler. The underfill layer is formed by filling a liquid resin.

(23) Separation of Support

Figure 22:
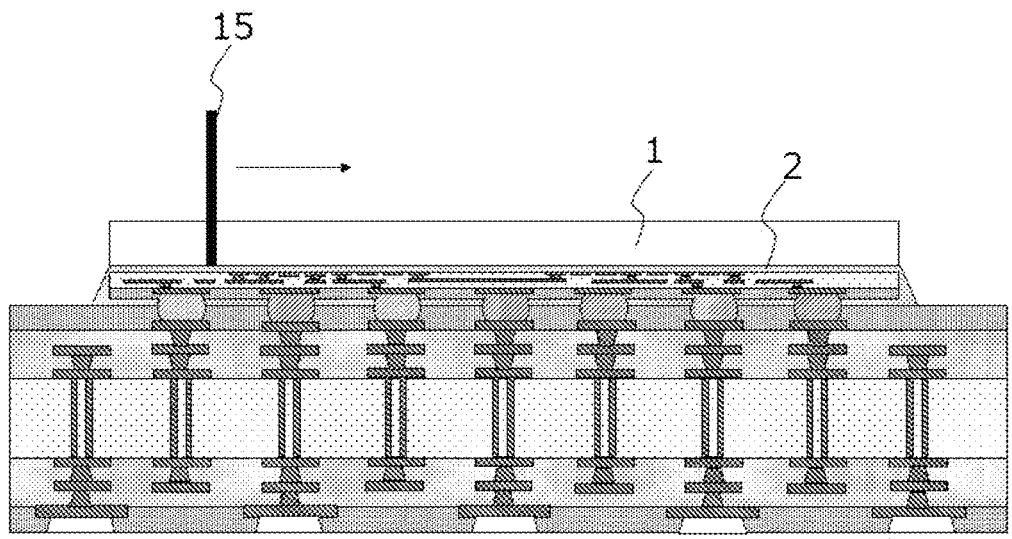
FIG. 22 is a cross-sectional view illustrating a state in which laser light is applied to the release layer.

Next, as shown in FIG. 22, laser light 15 is applied to the release layer 2 to bring it into a separable state and then the support 1 is separated. Specifically, the laser light 15 is applied to the release layer 2 formed at the interface with the support 1, from the rear surface of the support 1, i.e., from the surface of the support 1 opposite to the FC-BGA board 14, to bring the release layer 2 into a separable state for separation of the support 1.

(24) Completion of Wiring Board

Figure 23:
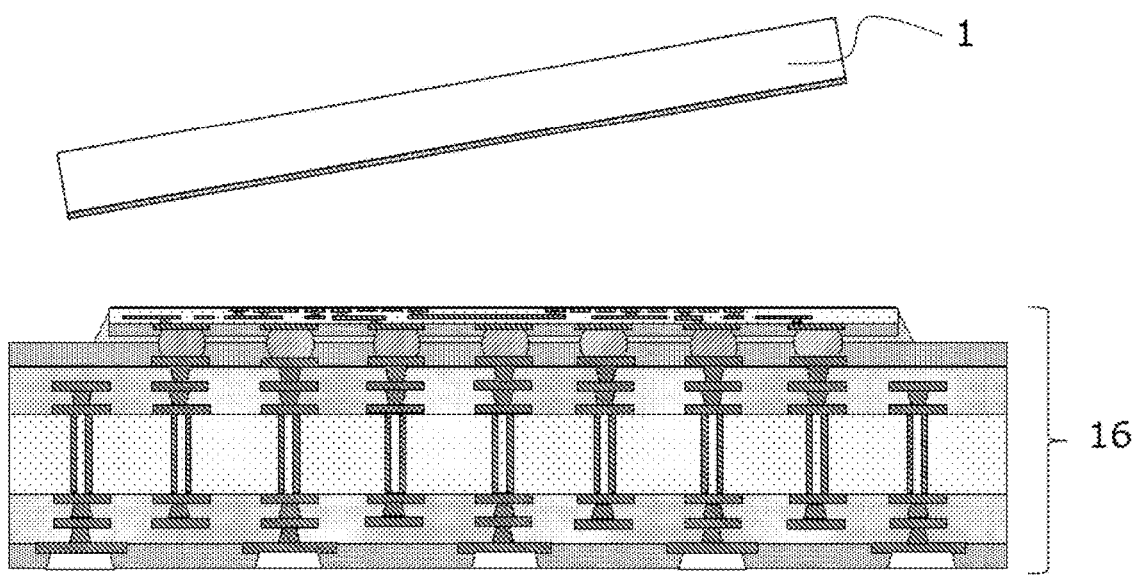
FIG. 23 is a cross-sectional view illustrating a state in which the support is removed.

Next, after removing the support 1 as shown in FIG. 23, the release layer 2, the seed adhesion layer 4, and the seed layer 5 are removed to obtain a wiring board 16.

(25) Mounding of Semiconductor Elements

After that, semiconductor elements 17 are mounted to complete a semiconductor device 18 shown in FIG. 1. In this case, prior to mounting the semiconductor elements 17, the conductor layer 6 exposed to the surface may be surface-treated using Ni/Pd/Au electroless plating, OSP, tin electroless plating, Ni/Au electroless plating, or the like to prevent oxidation and enhance wettability of the solder bumps. Through these processes, a semiconductor device 18 is completed.

<Confirmation of Functions and Effects>

Next, comparing the wiring board 16 prepared as described above is compared with a comparative example, and the comparative effects will be described.

The present inventors prepared examples having a structure of the wiring board 16 in which silicon nitride was used as the inorganic insulating films 7, 7', and comparative examples having the same structure as the wiring board 16 except that no inorganic insulating films 7, 7' were provided. These examples and comparative examples were subjected to high temperature and humidity bias testing for 96 hours at a temperature of 130° C., humidity of 85%, and applied voltage of 3.3 V. As a result, all of the comparative examples suffered from migration, but none of the examples suffered from migration or conduction failure. Thus, it was confirmed that the inorganic insulating films 7, 7' have an effect of suppressing migration.

According to the present embodiment, in the second wiring board which is provided with fine wiring layers on a support substrate and mounted to an FC-BGA board, by enclosing the wiring parts with a seed adhesion layer or an inorganic insulating film, the occurrence of cracking is suppressed in the photosensitive resin layer and disconnection of wires can be suppressed, and further, separation of the photosensitive resin can be suppressed even when warpage occurs in the board during heating, and thus reliability of the second wiring board can be enhanced.

Furthermore, by covering the entire wiring with an inorganic insulating film, the wire material is prevented from diffusing into the insulating resin, and this contributes to further improving reliability of the wiring board.

The present invention can be applied to semiconductor devices including a wiring board which is provided with an interposer, or the like intervened between a main board and IC chips.

REFERENCE SIGNS LIST

1: Support; 2: Release layer; 3: Photosensitive resin layer (insulating resin layer); 4: Seed adhesion layer; 5: Seed layer; 6: Conductor layer; 7, 7': Inorganic insulating film; 8: Resist pattern; 9: Conductor layer (for solder bonding); 10: Solder resist layer; 11: Surface treatment layer; 12: Solder joint; 13: Wiring board on support; 14: FC-BGA board; 15: Laser light; 16: Wiring board; 17: Semiconductor element; 18: Semiconductor device; 19: Chip connection terminal.

What is claimed is:

1. A wiring board, comprising:
   a first wiring board in which a first wiring layer is formed, and a second wiring board in which a second wiring layer finer than the first wiring layer is formed, the second wiring board having a first surface to which the first wiring board is bonded and a second surface to which semiconductor elements can be mounted,
   wherein an inorganic insulating film is formed between the second wiring layer and an insulating resin layer in the second wiring board, and
   wherein the second wiring board includes two or more insulating resin layers, an upper surface and a lower surface of one of the insulating resin layers being covered with respective inorganic insulating films.

2. The wiring board of claim 1, wherein second wiring layer portions are each enclosed by the insulating resin layer, and the insulating resin layer is adjacent to each of the second wiring layer portions with the inorganic insulating film interposed therebetween.

3. The wiring board of claim 1, wherein the second wiring board includes two or more second wiring layers, the second wiring layers vertically adjacent to each other being connected to each other via conductors in respective openings formed in the inorganic insulating film.

4. The wiring board of claim 1, wherein the inorganic insulating film is silicon nitride.

5. The wiring board of claim 1, wherein the insulating resin layer is formed of a photosensitive insulating resin.

6. A method of producing a wiring board comprising a first wiring board in which a first wiring layer is formed, and a second wiring board in which two or more second wiring layers finer than the first wiring layer are formed, the second wiring board having a first surface to which the first wiring board is bonded and a second surface to which semiconductor elements can be mounted, wherein the step of producing the second wiring board, comprising the steps of:
   forming a first insulating resin layer provided with a wiring pattern and openings corresponding to the second wiring layer;
   forming a first inorganic insulating film on the first insulating resin layer;
   forming a first conductor layer corresponding to the wiring pattern and the openings on the first inorganic insulating film; and
   forming a second inorganic insulating film on the first conductor layer, and
   forming the second insulating resin layer provided with a wiring pattern and openings on the second inorganic insulating film;
   forming openings in the second inorganic insulating film to align with the openings of the second insulating resin layer; and
   forming a second conductor layer electrically connected to the first conductor layer via the openings of the second inorganic insulating film.

7. The method of producing a wiring board of claim 6, wherein
   at least one of the first inorganic insulating film and the second inorganic insulating film is formed through a plasma CVD method using silicon nitride as a material.

* * * * *